(12) United States Patent
Peterman et al.

(10) Patent No.: US 7,382,449 B2
(45) Date of Patent: Jun. 3, 2008

(54) ALIGNMENT TOOL FOR PRECISE PATTERN TRANSFER

(75) Inventors: Mark C. Peterman, Jackson, WY (US); David M. Bloom, Jackson, WY (US)

(73) Assignee: Alces Technology, Jackson, WY (US)

( * ) Notice: Subject to any disclaimer, the term of this patent is extended or adjusted under 35 U.S.C. 154(b) by 295 days.

(21) Appl. No.: 10/905,210

(22) Filed: Dec. 21, 2004

(65) Prior Publication Data

US 2006/0130692 A1  Jun. 22, 2006

(51) Int. Cl.
*G01C 1/06* (2006.01)
(52) U.S. Cl. .................. 356/139.04; 356/614
(58) Field of Classification Search ........... 356/139.04, 356/121, 614, 620, 622, 399–401; 101/485, 101/41; 264/35, 227, 261; 216/41; 430/5, 430/30
See application file for complete search history.

(56) References Cited

U.S. PATENT DOCUMENTS 6,133,986 A * 10/2000 Johnson ................ 355/67
6,656,308 B2   12/2003 Hougham
2003/0047535 A1    3/2003 Schueller
2003/0213382 A1* 11/2003 Kendale et al. ........... 101/41

OTHER PUBLICATIONS

Keyence Corporation, Woodcliff Lake, NJ; LT-9000 product literature; accessed Sep. 30, 2004 at www.keyence.com.

* cited by examiner

*Primary Examiner*—Gregory J. Toatley, Jr.
*Assistant Examiner*—Tri T Ton
(74) *Attorney, Agent, or Firm*—NUPAT, LLC; Morrison Ulman (57) ABSTRACT

Multi-point confocal microscopy, bright field microscope imaging, computer-controlled positioning stages, and an algorithm for automated leveling are the basis for a powerful but simple tool for aligning stamps used in precise pattern transfer to substrates. The system is relatively inexpensive and brings a capability similar to that of a photolithographic mask aligner to the world of elastomeric-stamp-based lithography. Alignment of the stamp and substrate is possible without contact between the two before printing.

7 Claims, 5 Drawing Sheets

ALIGNMENT TOOL FOR PRECISE PATTERN TRANSFER

FEDERALLY SPONSORED RESEARCH AND DEVELOPMENT

This invention was made with U.S. Government support under NIH/NEI SBIR contract 1 R43 EY 15029-01. The U.S. Government has certain rights in this invention.

FIELD OF THE INVENTION

The field of the invention relates generally to precise pattern transfer lithography with elastomeric stamps. In particular it relates to optical alignment techniques and apparatus used in precise pattern transfer.

BACKGROUND

Microlithography refers generally to any of several processes by which patterns with small features are copied from a master image to an object such as a silicon wafer. One type of microlithography, called photolithography, is often used in semiconductor manufacturing to define a layer of an integrated circuit. In projection photolithography the image of a glass photomask is projected on a silicon wafer that is coated with a photographic emulsion or photoresist. The exposure of photoresist in a mask aligner is analogous to the exposure of photographic film in a camera.

A glass photomask has patterns of thin metal on its surface. These patterns are usually created by electron beam lithography in which a precisely controlled electron beam traces out shapes under computer control. The electron beam illuminates an electron beam resist which has been applied to a glass mask substrate coated with a thin layer of metal. After the resist is developed, the metal layer is etched away to form the desired pattern.

In contact photolithography, instead of projecting the image of a mask onto a wafer (or other substrate), one presses the mask itself onto the wafer. The wafer is then exposed through the mask by illumination from a bright light source. In general, contact photolithography is not capable of reproducing as small features as projection photolithography, but it is considerably less expensive.

One of the main reasons that photolithography is so important in integrated circuit manufacturing is that patterns representing transistors and other circuit elements with very small features may be printed over and over on silicon wafers. State of the art photolithography systems now print with better than 100 nanometer resolution.

Recently, researchers have taken advantage of microlithography techniques to create very small mechanical devices instead of electronic circuits. These devices, sometimes known as "micro-electro-mechanical systems" or MEMS have found applications in devices as diverse as movie projectors and accelerometers. MEMS are often created using surplus microlithography equipment procured from integrated circuit manufacturers. MEMS technology is still relatively new and normally does not require state of the art lithography tools.

Even more recently, researchers in chemistry and biology have realized the value of printing very small patterns for their experiments. For example, biologists have created DNA array chips which enable them to perform thousands or even millions of simple DNA experiments simultaneously. Chemists and biologists have found great value in printing thin layers of chemical and biological materials. The simplest and least expensive method of printing these materials is simply to stamp them using a method very similar to stamping ink patterns on paper with a rubber stamp. The new method is variously called "microcontact printing", "soft lithography" or simply "precise pattern transfer."

One of the innovations inherent in precise pattern transfer was the discovery that elastomeric stamps, especially those made from poly-dimethylsiloxane ("PDMS") are capable of stamping patterns with feature sizes less than one micron. Precise pattern transfer by PDMS stamping has become a very popular research tool in chemical, biological and MEMS research. Typically a PDMS stamp is created by molding liquid PDMS on an etched mold originally defined photolithographically. After the PDMS cures into a rubbery state it may be peeled off the mold, wetted with various "inks" and stamped on flat or even a curved substrates.

Precise pattern transfer brought the power of microlithography to researchers in diverse disciplines. However, precise pattern transfer as currently practiced has critical limitations compared to photolithography. For example, it's hard to line up the stamp with pre-existing patterns on the substrate.

Alignment of the stamp with substrate features is critical to all but the simplest applications of precise pattern transfer. Without alignment capability stamped patterns can only be roughly located on the substrate and aligning subsequent patterns to previously created patterns is difficult. Crude alignment is currently done by hand. It would be highly desirable to have at least a semi-automatic alignment system for precise pattern transfer by stamping.

Another limitation of stamping techniques is that it is nearly impossible to orient the surface of the stamp relative to the substrate surface with precision. When a stamp is applied by hand, or even with the aid of simple mechanical devices, one part of the stamp tends to touch the substrate surface before the rest. In other words, the stamp is tilted with respect to the substrate.

A tilted stamp leads to at least two problems. First, the stamp may be distorted when only one part of it is touching the printing surface while other parts do not. Second, a tilt will lead to uneven pressure over the surface of the stamp when the stamp is in contact with the substrate. Uneven pressure leads to uneven printing and distortion of printed features. It might seem that slight tilts and variations in stamping pressure would not matter, but in fact control of these parameters is critical when stamped feature sizes are in the micron range.

The limitations of precise pattern transfer are widely known and have inspired several researchers to try to improve stamping techniques. Schueller (see US Patent Application Publication 2003/0047535, incorporated herein by reference), for example, recognizes some of the limitations of current stamping techniques and presents a list of conventional methods to solve current problems.

Kendale (see US Patent Application Publication 2003/0213382, incorporated herein by reference), proposes a system in which a spring-supported stamp is brought into contact with a test substrate for purposes of determining the proper orientation of the stamp in subsequent printing operations.

Hougham (see U.S. Pat. No. 6,656,308, incorporated herein by reference) teaches a process for making elastomeric stamps flatter and less prone to distortion when released from their molds. This method improves the quality of stamped patterns and is a step toward making microcontact printing useful in microcircuit applications.

Despite the progress made by these and other researchers in the field there is a strong need for a simple system for precise pattern transfer by stamping. Ideally such a system would both level a stamp with respect to a substrate and allow the stamp to be aligned to features on the substrate prior to coming in contact with the substrate. It would also be desirable for leveling and aligning procedures to be carried out automatically or under an operator's supervision.

SUMMARY

In order to overcome the foregoing deficiencies of conventional systems, an aspect of the invention provides an alignment system for precise pattern transfer comprising a confocal optical system for measuring the position of at least three points on the surface of a transparent stamp and on a printing substrate, one or more multi-axis positioning stages to position the stamp with respect to the optical system and a substrate, and a bright field imaging system for inspecting the stamp and the substrate during alignment of the stamp to the substrate. The confocal optical system has the advantage that points not all lying on one line are easily measured. Further, the system allows one to position the stamp and substrate parallel to one another and align features on the stamp and substrate to one another prior to the stamp contacting the substrate.

BRIEF DESCRIPTION OF THE DRAWINGS

The drawings are heuristic for clarity. The foregoing and other features, aspects and advantages of the invention will become better understood with regard to the following descriptions, appended claims and accompanying drawings in which:

DETAILED DESCRIPTION

An aspect of the invention provides a system for aligning a stamp to a substrate in a precise pattern transfer operation. The system uses principles of confocal microscopy in a novel arrangement to determine the position of a stamp relative to a printing substrate. The system also comprises multi-axis positioning stages which may be motorized and controlled by computer for automatic operation.

An alignment and leveling system according to an aspect of the invention has the advantage that a stamp may be positioned for precise pattern transfer prior to contacting a substrate for printing. The system allows one to first determine whether and how much the stamp surface is tilted with respect to the substrate. Second, the stamp and substrate are rotated so that they are parallel to one another. Then the stamp and substrate are brought in close proximity to one another without touching. At this stage alignment of the stamp and substrate are performed. Finally, the stamp and substrate are brought into contact under precise control for printing.

The method of detecting where the surface of the stamp is in relation to the substrate incorporates confocal microscopy which is an optical ranging technique. In confocal microscopy the distance between a high numerical aperture lens and a reflecting surface is measured by taking advantage of the imaging properties and relatively short depth of focus of the lens.

In order to better understand various aspects of the invention it is useful to briefly review confocal microscopy techniques and properties of optical lenses. When a point source of light is located a distance $d_1$ away from a lens of focal length f, the light will be focused a distance $d_2$ away from the lens on the opposite side. According to the Gaussian lens formula the relationship between the distances and the focal length of the lens is $1/d_1+1/d_2=1/f$. If a plane mirror is placed $d_2$ away from the lens, it will reflect the light focused there back to the light source at $d_1$. Alternatively, if the mirror is placed at a different distance $d_2'$, then the light will be reflected back and focus at $d_1'$ somewhere away from $d_1$. Meanwhile, at $d_1$ the reflected light will not be focused to as small a spot as the area of the light source itself. Therefore, if the light source at $d_1$ consists of light emanating from a small pinhole, the amount of light reflected back through the pinhole is maximized when the mirror is at $d_2$ and $1/d_1+1/d_2=1/f$.

Confocal microscopy takes advantage of these optical properties to determine the distance away from a lens of a mirror or other reflective (or partially reflective) surface. Further, if the reflective surface is moved laterally under the lens, small variations in its surface height may be detected. It is sometimes easier, however, to move the lens rather than the reflective surface. The focal spot of a lens moves laterally with the lens for small lens displacements.

Figure 1A:
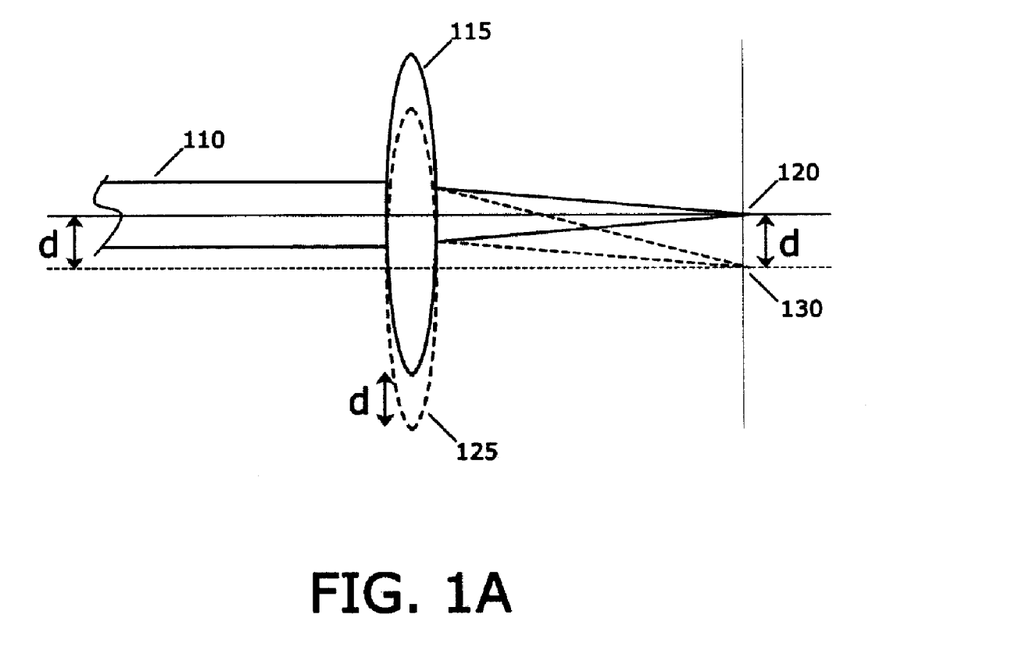
FIGS. 1A and 1B schematically show useful properties of conventional optical lenses.

Referring to FIG. 1A a lens is shown focusing a beam of light to a small spot. Light beam 110 is incident upon lens 115 and is focused at spot 120. Light beam 110 is centered on the axis of lens 115. If lens 115 is displaced laterally by a distance d to new position 125, focal spot 120 also moves laterally by distance d to new position 130. Using this principle, focal spots may be moved laterally over short distances by moving the lenses which create them.

Figure 1B:
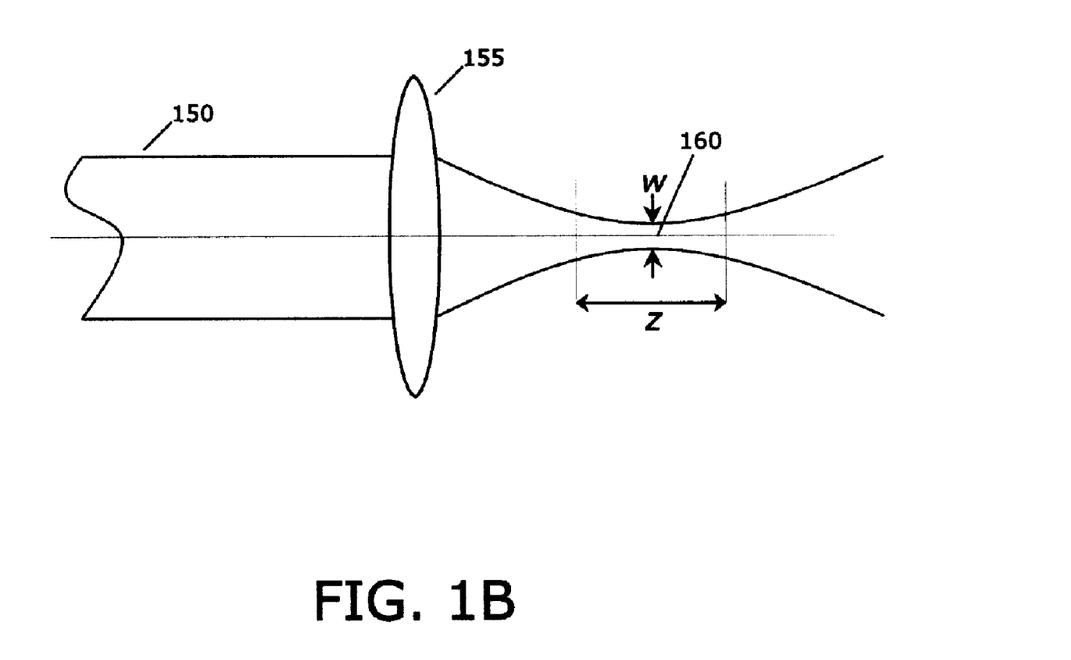

The depth resolution of the confocal microscopy technique is determined in part by the numerical aperture of the lens used. In FIG. 1B, light beam 150 is incident upon lens 155 which focuses the beam at point 160. The beam waist or transverse size of the beam is denoted by w in the figure while z denotes the depth of focus. The depth of focus z is a characteristic distance over which the transverse dimension of the beam is comparable to w. z is proportional to the wavelength of the light divided by the square of the numerical aperture of the lens. In a typical confocal microscopy set-up z is less than 10 microns.

Figure 2:
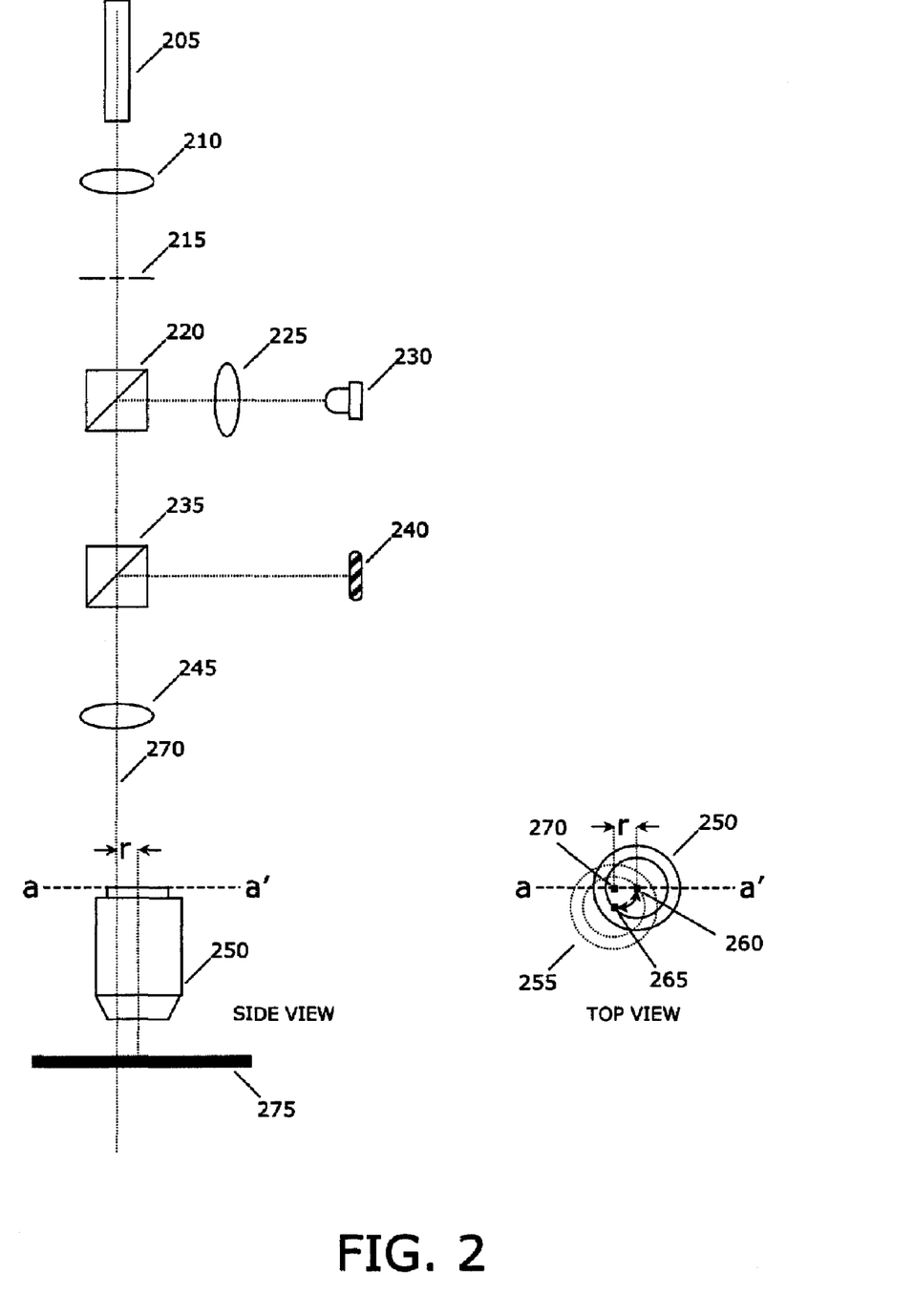
FIG. 2 is an optical schematic diagram of part of an alignment and leveling system according to the present invention.
Figure 3:
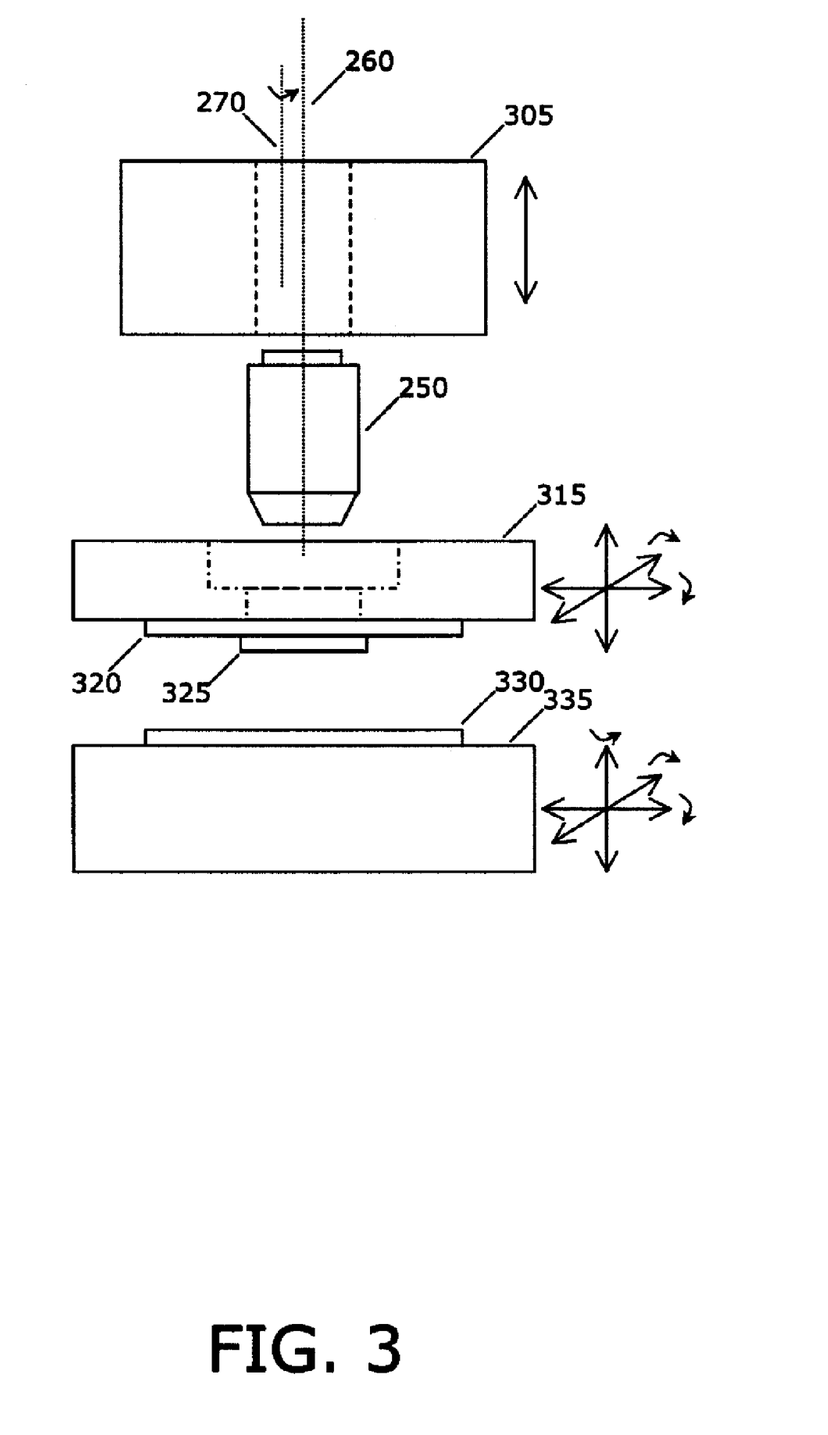
FIG. 3 is a schematic diagram of various mechanical translation and rotation stages in an alignment and leveling system according to the present invention.

FIGS. 2 and 3 show optical and mechanical components of an alignment and leveling system according to an aspect of the invention. FIG. 2 illustrates a novel confocal microscopy arrangement while FIG. 3 illustrates positioning apparatus for moving a microscope objective, a precise pattern transfer stamp and a printing substrate relative to each other.

In FIG. 2 an optical schematic diagram of part of an alignment and leveling system according to an aspect of the invention is shown. The optical set up comprises a confocal microscope with an offset microscope objective, a charge-coupled-device (CCD) detection system and a bright field illumination system, all shown in side view. The microscope objective is also shown in top view to further illustrate how it is offset from the optical axis of the rest of the system.

In FIG. 2 item 205 is a laser or other light source. Light from laser 205 passes through lens 210 and optional pinholes 215. Pinholes 215 are optional because they may be used in some embodiments, but are not always required as explained below. Next, the light passes through beamsplitters 220 and 235 before passing through lens 245. Finally the light is focused in microscope objective lens 250. Item 230 is an LED for bright field, out-of-focus illumination of the surface being imaged in the microscope. Light from LED 230 passes through lens 225 before being deflected into the optical axis of the microscope by beamsplitter 220. Item 240 is a CCD array imager which detects an in-focus image by collecting light reflected by beamsplitter 235. The output of the CCD array may be viewed on a computer or other image display device (not shown). Item 275 represents the surface that is being measured by the optical system. It could be the surface of stamp 325 or substrate 330, for example.

CCD array 240 can perform several different functions. For example, it can be used to inspect objects in the focal plane of the microscope objective. With the aid of a computer and appropriate interface software, CCD array 240 can also be used as a group of single-pixel optical detectors. Specific pixels in the array may be monitored for the intensity of light striking them. In this way specific pixels may act like larger area detectors placed behind small pinhole apertures.

Microscope objective 250 is mounted such that its axis may be displaced from the axis of the rest of the optical system 270. In FIG. 2 the offset distance between the axis 260 of the microscope objective and the system optical axis 270 is denoted by r in both the top and side views. It is convenient to mount objective 250 on a rotating stage. The rotating stage allows the objective to move to different positions where the offset distance r is maintained and the objective axis 260 remains parallel to the system axis 270. An example of such a position is illustrated in the top view of the objective.

In the top view objective 250 is shown with its axis 260 displaced from the optical system axis 270 by a distance r. Also shown by dotted lines is the objective in a different position 255 obtained by rotating the objective around optical system axis 270. The objective axis moves to new position 265. Rotating the microscope objective as illustrated in the top view of FIG. 2 is a simple way to move a lens offset in different directions so that different points on the surfaced to be imaged may be observed An advantage of rotating the microscope objective rather than simply translating it linearly is that several different non-collinear points may be measured. When the locations of at least three points, not all lying on the same line, are known the points define a plane. If the microscope objective only traveled along a line, the points measured on a surface would not be sufficient to define a unique plane.

In a first mode of operation the microscope apparatus illustrated in FIG. 2 makes use of multiple off-axis pinholes 215 in conjunction with a microscope objective 250 that may be displaced off axis by an amount r as illustrated or may be in fact place on axis (r=0) in some cases. The multiple pinholes create spots of light on the surface to be imaged and the reflections of those spots are seen at certain pixels in CCD array 240.

In a second mode of operation pinholes 215 are not used. Instead the small spot from laser 205 is focused on the surface to be imaged and, after reflection from that surface, detected at one or more pixels in CCD array 240. In this mode of operation, objective 250 is displaced from axis 270 by a small distance r (r>0) and the objective is rotated to various positions analogous to position 255. In this way several spots on the surface to be imaged can be measured sequentially.

FIG. 3 is a schematic diagram of various mechanical translation and rotation stages in an alignment and leveling system according to an aspect of the invention. The purpose of the stages is to position microscope objective 250, stamp 325, and sample 330 with respect to each other. It is most convenient if each of the stages has six degrees of freedom motion, namely: translation along each of three orthogonal axes and rotation about each of those axes. The microscope objective should be adjustable so that an offset between its optical axis and that of the rest of the optical system can be established and so that the objective can rotate around the system optical axis as described in connection with FIG. 2.

In experimental testing, a voice coil actuator 305 was used to move objective 250 parallel to the optical axes of the objective and the rest of the optical system. Stages 315 and 335 were five and six axis micropositioners respectively and were driven by computer-controlled actuators (PICOMOTOR (™) actuators obtained from NewFocus, Inc., Santa Clara, Calif.). The movement directions for an experimental system are illustrated in FIG. 3 by straight and curved arrows.

In FIG. 3 stamp 325 is an elastomeric stamp made of PDMS. It is conveniently mounted on glass slide 320 which is in turn mounted on positioning stage 315. PDMS is transparent; therefore either its front or back surface may be imaged in the microscope. In experimental testing the PDMS stamp was about 2 millimeters thick. The substrate on which patterns are printed 330 is most often a silicon or glass wafer.

Positioners 315 and 335 are used to tilt stamp 325 and substrate 330 so that their surfaces are parallel. Once the surfaces are parallel they are brought into close proximity, usually about 40 microns apart. At this point, the two surfaces are aligned to one another by translating and/or rotating them in their respective planes. Once the surfaces are parallel and aligned, they are brought into contact for printing.

For best printing fidelity the contact pressure between the stamp and the substrate must be controlled. Several methods are used to control the pressure. One method is to move the stamp and the substrate toward each other until contact and then continue moving stages 315 and 335 toward each other by an additional predetermined distance. This distance may be a fraction of a micron to a few microns. Another method is to attach substrate 330 to stage 335 using spring flexure mounts. Such mounts are readily available with known spring constants. The contact pressure is then determined by the spring constant of the flexure mount and the distance that it is flexed. A third method is to use actuators that have force sensors built into them.

Mechanical stages are used to bring the stamp and substrate into alignment and subsequent contact as just described, but it is the optical system that is used to detect the position of these components and to inspect them during the alignment process. The optical system has the advantage that confocal microscopy and bright field imaging may be performed simultaneously with the same apparatus. Confocal microscopy is used to find the position of the stamp and substrate surfaces while bright field imaging is used for alignment of features on the surfaces.

Part of confocal microscopy technique involves measuring the intensity of light passing through a small aperture. This is often accomplished by placing a relatively large area photodetector behind a small aperture. Equivalently, a small area photodetector such as one or more pixels in a CCD array may take the place of a small aperture with a large area detector behind it. The size of the CCD array pixel sets the effective aperture size. In experimental testing 25 micron diameter pinholes were used as was a CCD array with 6 micron diameter pixels.

Figure 4A:
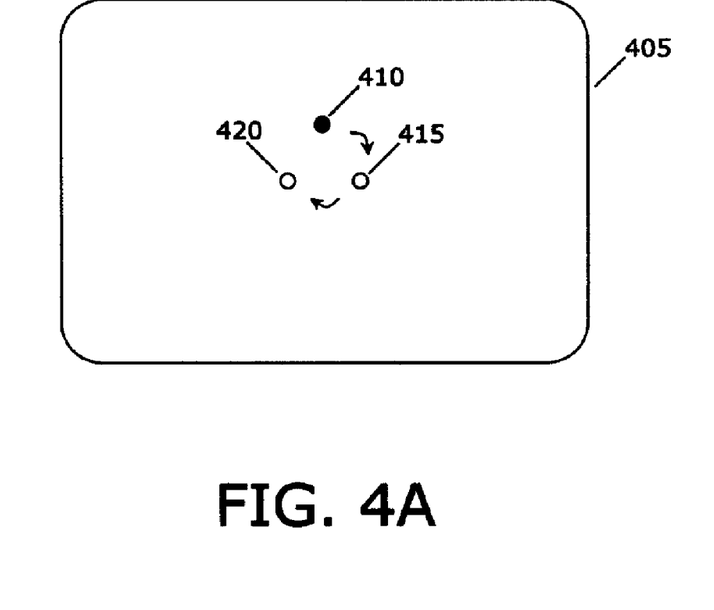
FIGS. 4A and 4B schematically show spots of light on a CCD device in an alignment and leveling system according to the present invention.
Figure 4B:
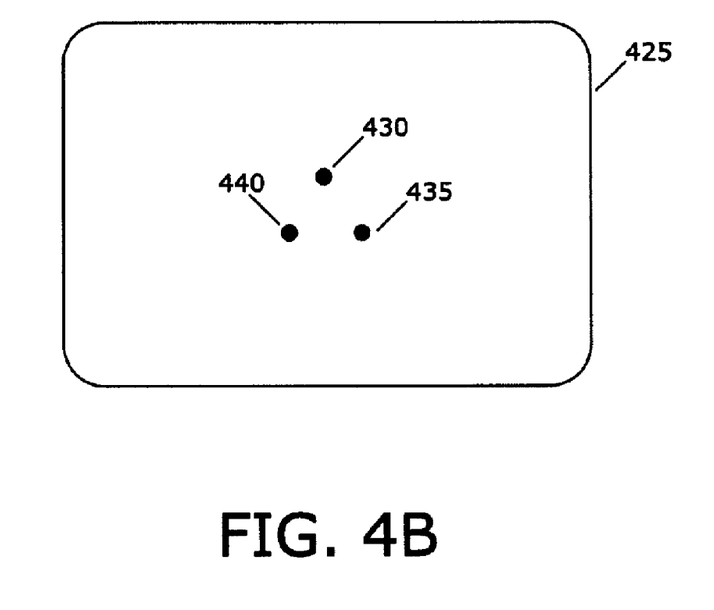

FIGS. 4A and 4B show spots of light on the detecting surface 405, 425 of CCD image detector 240. The intensity of the spots of light over single pixels, or just a few pixels, in the CCD array is measured to determine the distance away from microscope objective 250 of a reflecting surface. The reflecting surface may be the surface of stamp 325, the surface of substrate 330, or another surface of interest.

In FIG. 4A spot of light 410 is shown on CCD array 405. Positions 415 and 420 are locations to which spot 410 is moved by rotating microscope objective 250 around system optical axis 270. When light is focused at spot 410 the height of one point on the surface to be image is measured by confocal microscopy techniques. Subsequent surface height measurements are made at other locations by rotating microscope objective 250 to new positions. Height measurements at these other locations are performed by confocal microscopy in which spot locations such as locations 415 and 420 are used. Once the height of the surface being measured is known at three points, the location of a plane representing that surface is calculated. To the extent that the measured surface is a flat surface, the calculated plane determines the location of the surface.

An alternate method of performing confocal microscopy at three or more points on a surface involves the use of a multiple pinhole such as pinholes 215. Referring back to FIG. 2, pinholes 215 are three or more small pinhole apertures in an otherwise opaque, thin structure. Light passing through the pinholes is imaged onto the surface to be measured 275. The light is then reflected back from the surface and imaged onto CCD array 240. In FIG. 4B, three spots of light 430, 435, and 440 are shown on a CCD array 425. In the figure, spots 430 and 440 are drawn with equal brightness, represented by black circles. Spot 435 is drawn in gray, indicating a spot of lesser intensity compared to spots 430 and 440. The pinhole method of confocal imaging has the property that three or more spots may be monitored at one time. The location of spots on the CCD array where light intensity is monitored may be selected electronically. In FIG. 4B the existence of two bright spots and one less bright spot indicates that the surface being measured is tilted; i.e. the three points on the surface which reflect light back to the CCD array are not all at equal distance from the microscope objective.

Either the sequential confocal microscopy procedure of FIG. 4A or the simultaneous confocal microscopy procedure of FIG. 4B may be used to determine the distance away from the microscope objective of multiple points on the surface being measured. Pinholes are useful when a small spacing between spots is desired such as for a small stamp. The maximum pinhole spacing is determined by the field of view of the microscope objective. Higher power objectives have smaller field of view compared to lower power objectives. The rotating objective method is more useful for working with large size stamps.

The distances of various points are then used to determine the position of the surface. This method is used to find the position of both the stamp surface and the position of the surface to which the stamp will be applied. Any difference in the orientation of the two surfaces may then be removed by adjusting motorized stages 315 and 335. The stamp and surface to be printed on are then moved close together, but not touching, for alignment purposes. The separation distance during alignment is normally about 40 microns but could be between about 10 and about 100 microns.

When the stamp and printing surface are parallel but separated (e.g. by about 40 microns), features on both surfaces can be viewed with CCD array 240 at the same time. Bright field illumination is provided by LED 230. With both surfaces simultaneously in view, features on the stamp may be aligned with features on the substrate. This is accomplished by translating and rotating the stamp or the substrate surfaces or both in their respective planes. When all features, such as standard alignment marks, are aligned, the stamp and substrate are brought into contact by translating one or both of them toward the other in a direction perpendicular to their surfaces.

The foregoing steps are automated by a system in which the intensity of light collected at various pixels in the CCD array is monitored by computer and the adjustment of the various positioning stages is directed by computer.

Figure 5:
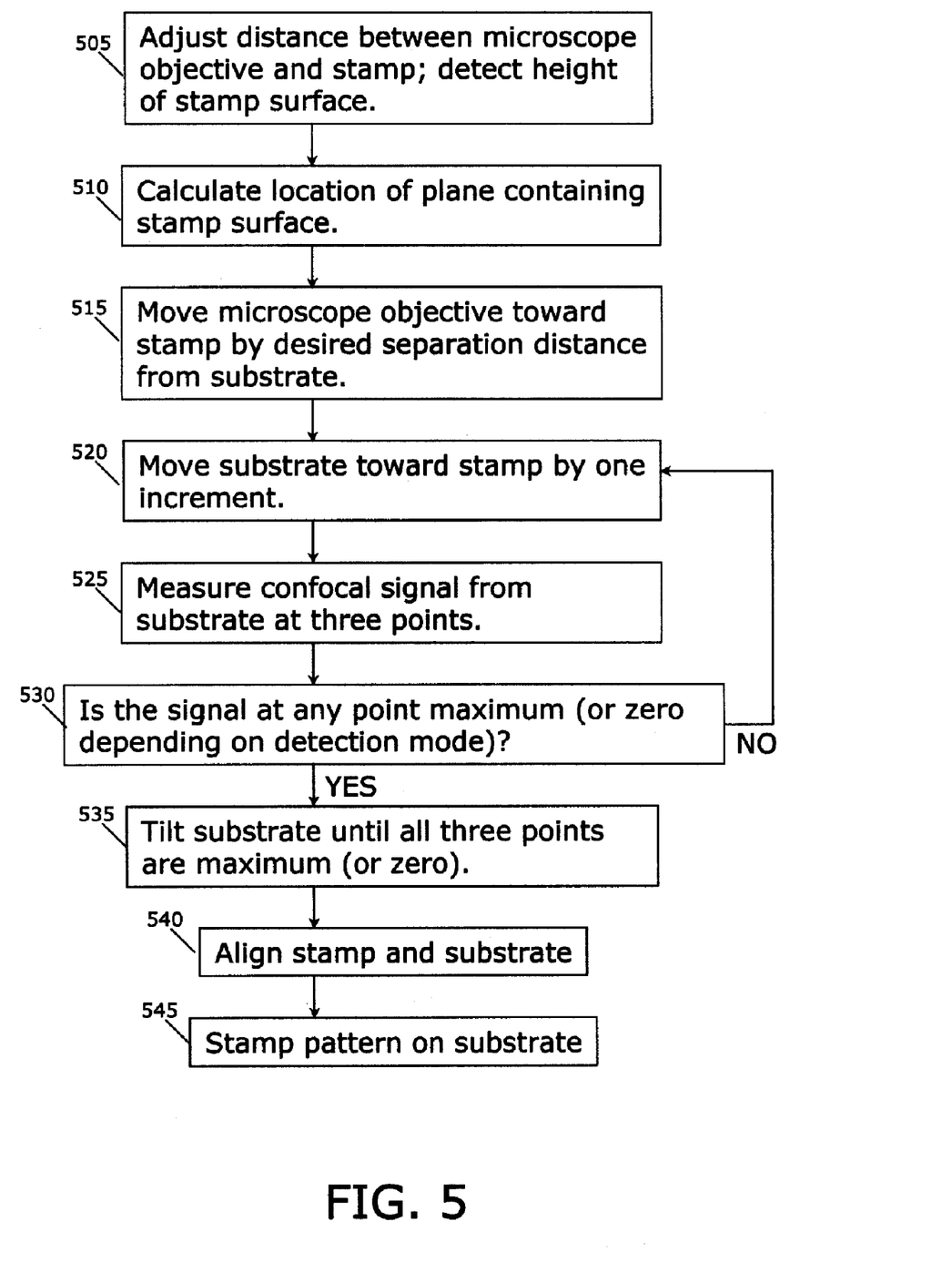
FIG. 5 is a flow chart for an alignment procedure according to the present invention.

FIG. 5 is a flow chart for automated operation of the alignment system. Following the chart, in step 505 the distance between microscope objective 250 and the printing surface of stamp 325 is adjusted using actuator 305 until the surface is in focus as measured by confocal microscopy. This step is repeated at several points on the stamp surface. By keeping track of how much actuator 305 is displaced at each point measured, the height of the stamp surface is determined.

Once the height of the stamp surface is known at three or more points, the location of a plane containing the stamp surface is calculated and recorded in step 510. The next step 515 is to move the microscope objective toward the stamp by a predetermined distance. This distance will be the distance by which the stamp and the substrate are separated when they are brought parallel to each other and aligned. Normally the separation distance is approximately 40 microns. If the separation distance is too small, there is a chance that the two surfaces will touch each other during the leveling process. If the separation distance is too large, it is not possible to keep both surfaces in focus during alignment.

Once the separation distance is established in step 515, the substrate 330 is moved toward the stamp a small increment by stage 335. A convenient small increment is about 1 micron although increments as small as about 0.1 microns up to as large as about 3 microns are sometimes used. After the substrate has been moved toward the stamp by an increment, the confocal light intensity signal from each of at least three points on the substrate is measured in step 525. In step 530 a determination is made as to whether the light intensity signal from any one of the points being monitored has reached its maximum. If so, that point is separated from the stamp surface by the separation distance selected in step 515. In that case, the next step 535 is to tilt the substrate stage toward the stamp until the intensity at the other points is also maximized. If the maximum has not been reached at step 530, the substrate is moved toward the stamp by another increment according to step 520.

Confocal microscopy involves measuring the intensity of light passing through an aperture (or the intensity collected by a small area photodetector) and determining what distance between the lens and reflective surface maximizes the intensity. However, it is also possible to perform confocal microscopy in a differential mode. Instead of measuring light intensity as a function of fixed microscope positions one may measure the change in light intensity as a function of change in microscope objective position. The point of maximum intensity referred to earlier is also a point where the change in light intensity versus change in objective position is zero. Experimentally, it is often easier to detect a null than a maximum so this mode of operation may be preferred in some situations. To use this differential mode of operation, the microscope objective is moved up and down repetitively by actuator 305 while the intensity of light spots such as spots 410 or 430, 435, 440 is continuously monitored. In steps 530 and 535 "zero" applies if a differential mode of measurement is used.

After the completion of step 535 the substrate and the stamp are parallel to each other. At this point the stamp and substrate may be aligned. Alignment may be performed manually by observation of the two surfaces or automatically with image processing software to analyze image data from the CCD array.

The last step 545 is to bring the stamp into contact with the substrate. This is accomplished by moving either stage 335 or 315 toward the other. Precision stages are adjusted by fine-pitch adjustment screws which are driven by computer controlled actuators such as PICOMOTOR (™) actuators obtained from NewFocus, Inc., Santa Clara, Calif.

The combination of multi-point confocal microscopy, bright field microscope imaging, computer-controlled positioning stages, and an algorithm for automated leveling is the basis for a powerful but simple tool for aligning stamps used in precise pattern transfer to substrates. The system is relatively inexpensive and brings a capability similar to that of a photolithographic mask aligner to the world of elastomeric-stamp-based lithography. Alignment of the stamp and substrate is performed without contact between the two before printing.

Furthermore it will be apparent to those skilled in the art that the optical leveling techniques described here are also applicable to leveling a photomask in a contact photolithographic mask aligner.

As one skilled in the art will readily appreciate from the disclosure of the present invention, processes, machines, manufacture, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, means, methods, or steps.

While the invention has been described in connection with what are presently considered to be the most practical and preferred embodiments, it is to be understood that the invention is not limited to the disclosed embodiments and alternatives as set forth above, but on the contrary is intended to cover various modifications and equivalent arrangements included within the scope of the following claims.

What is claimed is:

1. An alignment system for precise pattern transfer comprising:
    a microscope objective offset from an axis of a confocal optical detection system that provides spots of light on an imaged surface;
    an array detector for detecting brightness of one or more of the spots of light; and,
    two or more multi-axis positioning stages for positioning relative to one another; the microscope objective, a stamp, and a printing substrate according to the detected brightness.

2. An alignment system as in claim 1 further comprising an automated control system for controlling the multi-axis positioning stages.

3. An alignment system for precise pattern transfer comprising:
    three or more pinhole apertures in a confocal optical detection system;
    an image sensor for detecting the brightness of three or more images of the pinhole aperture(s); and,
    two or more multi-axis positioning stages for positioning relative to one another; a microscope objective, a stamp, and a substrate according to the detected brightness.

4. An alignment system as in claim 3 further comprising an automated control system for controlling the multi-axis positioning stages.

5. An alignment system for precise pattern transfer comprising:
    a confocal optical system for measuring the position of at least three points on the surface of a transparent stamp;
    two or more multi-axis positioning stages for positioning the stamp with respect to a substrate and the optical system; and,
    a bright-field imaging system for inspecting the stamp and the substrate simultaneously to facilitate alignment of the stamp to the substrate.

6. An alignment system as in claim 5 wherein the three points do not all lie on the same line.

7. An alignment system as in claim 5 wherein the stamp and substrate are positioned parallel to one another and features on the stamp and substrate are aligned with one another prior to contact between the stamp and the substrate.

* * * * *